United States Patent
Schweitzer, Jr.

[11] Patent Number: 5,274,324
[45] Date of Patent: Dec. 28, 1993

[54] HOT LINE MOUNTABLE HOTLINE INDICATOR HAVING LIQUID CRYSTAL DISPLAY WITH RESETTABLE MEMORY FUNCTION

[76] Inventor: Edmund O. Schweitzer, Jr., 2433 Center St., Northbrook, Ill. 60062

[21] Appl. No.: 641,815

[22] Filed: Jan. 16, 1991

Related U.S. Application Data

[63] Continuation of Ser. No. 502,116, Mar. 29, 1990, which is a continuation-in-part of Ser. No. 433,665, Nov. 8, 1989, abandoned.

[51] Int. Cl.⁵ .............................. G01R 19/16
[52] U.S. Cl. .................... 324/96; 324/126; 324/133
[58] Field of Search ................. 324/96, 126, 127, 133, 324/111, 115, 72.5; 340/664, 663, 654

[56] References Cited

U.S. PATENT DOCUMENTS

| | | | |
|---|---|---|---|
| 3,425,049 | 1/1969 | Robinson | 324/133 |
| 3,624,501 | 11/1971 | Joseph | 324/111 |
| 3,660,757 | 5/1972 | Winslow | 324/122 |
| 3,667,039 | 5/1972 | Garfein et al. | 324/92 |
| 3,708,784 | 1/1973 | Spencer | 340/654 |
| 3,969,671 | 7/1976 | Smith | 324/109 |
| 4,139,820 | 2/1979 | Rode | 324/133 |
| 4,152,639 | 5/1979 | Chaffee | 324/51 |
| 4,152,643 | 5/1979 | Schweitzer, Jr. | 324/133 |
| 4,259,634 | 3/1981 | Okamoto et al. | 324/74 |
| 4,263,550 | 4/1981 | Schweitzer, Jr. | 324/133 |
| 4,301,407 | 11/1981 | Koslar | 324/96 |
| 4,503,389 | 3/1985 | Singer | 324/133 |
| 4,550,288 | 10/1985 | Schweitzer, Jr. | 324/133 |
| 4,559,496 | 12/1985 | Harnden, Jr. et al. | 324/122 |
| 4,614,940 | 9/1986 | Jaeckle | 340/663 |
| 4,634,971 | 1/1987 | Johnson et al. | 324/133 |
| 4,641,220 | 2/1987 | Schweitzer, Jr. | 361/187 |
| 4,714,916 | 12/1987 | Schweitzer, Jr. | 340/664 |
| 4,823,078 | 4/1989 | Mohebban | 324/133 |

FOREIGN PATENT DOCUMENTS

| | | | |
|---|---|---|---|
| 2825991 | 1/1980 | Fed. Rep. of Germany | 324/133 |
| 1011161 | 6/1932 | France | |
| 1199016 | 7/1970 | United Kingdom | |
| 2049205 | 12/1980 | United Kingdom | 324/133 |

OTHER PUBLICATIONS

"Product Development Profile Rough Life of Digital Multimeter Puts Tough Demands on Design"; Electronics; Jun. 23, 1977 pp. 107–112.

"Liquid Crystal Display", a publication of Hamlin Inc., Lake and Grove Streets, Lake Mills, Wisconsin, circa Jun. 1, 1989.

*Primary Examiner*—Vinh Nguyen
*Attorney, Agent, or Firm*—Lockwook, Alex, FitzGibbon & Cummings

[57] ABSTRACT

A hot line indicator for instantaneously indicating the presence of voltage on an electrical conductor in an AC power distribution system includes a unitary one-piece housing having a projecting metallic probe and a hookeye for engaging a conventional lineman's hot stick. Within the housing, the display electrodes of a high impedance liquid crystal display component are coupled to the monitored conductor through the probe and a capacitive coupling to ground to provide an unambiguous "HL" display indicative of the presence of voltage on the conductor.

16 Claims, 4 Drawing Sheets

HOT LINE MOUNTABLE HOTLINE INDICATOR HAVING LIQUID CRYSTAL DISPLAY WITH RESETTABLE MEMORY FUNCTION

This application is a continuation of application Ser. No. 502,116, filed Mar. 29, 1990, which is a continuation-in-part of U.S. application Ser. No. 433,665, filed Nov. 8, 1989, now abandoned.

BACKGROUND OF THE INVENTION

The present invention is directed generally to circuit monitoring devices, and more particularly, to an improved hot line indicator.

Various devices have been developed for testing for the presence of high voltage on electrical conductors in power distribution systems to reduce the hazard of working on or near such systems.

One such early device was an electroscope wherein a pivoted vane was arranged to be repelled from a fixed vane on contact with an energized line. This device had to be positioned very precisely since the force of electrostatic repulsion of the vanes was relatively small and opposed by gravity. Another early device utilized an incandescent lamp in conjunction with a high resistance series resistor to ground. This device was cumbersome, could not detect small charges or high voltages through a high impedance, and required an ohmic ground connection. Later versions of this device which substituted a meter for the lamp were also unsatisfactory.

More recently, neon glow lamp devices, popularly called statiscopes, have come to be employed as voltage detectors. The neon lamp used in such statiscopes unfortunately provides a dim indication of voltage which is difficult to see from the end of a lineman's hot stick.

The present invention overcomes these drawbacks by providing a hot line indicator which incorporates a high impedance non-mechanical visual display device in the form of a liquid crystal display. This results in an indicator of increased sensitivity which is more compact and easier to manufacture, does not require an external ohmic connection to ground and which provides a large non-ambiguous indication to the user as to whether a monitored line is powered.

Accordingly, it is a general object of the present invention to provide a new and improved hot line indicator.

It is a more specific object of the present invention to provide a hot line indicator which avoids the use of electromechanical indicator mechanisms.

It is a still more specific object of the invention to provide a hot line indicator which is more compact and easier to manufacture.

SUMMARY OF THE INVENTION

The invention is directed to a hot line indicator for indicating the presence of voltage on an electrical conductor. The indicator includes a housing, a probe, a ground coupling member and status indicating means within the housing comprising a high impedance display device having at least one pair of display electrodes disposed in operative association with a layer of voltage-responsive light controlling material, the display device providing on the exterior of the housing a first display condition in the absence of an actuating signal applied to the display electrodes, and a second display condition in the presence of an actuating signal applied to the display electrodes. Circuit means within the housing electrically couple the display electrodes to the probe, and electrical ground such that an actuating signal is applied to the display device in the presence of voltage on the probe to condition the display device to the second display condition.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
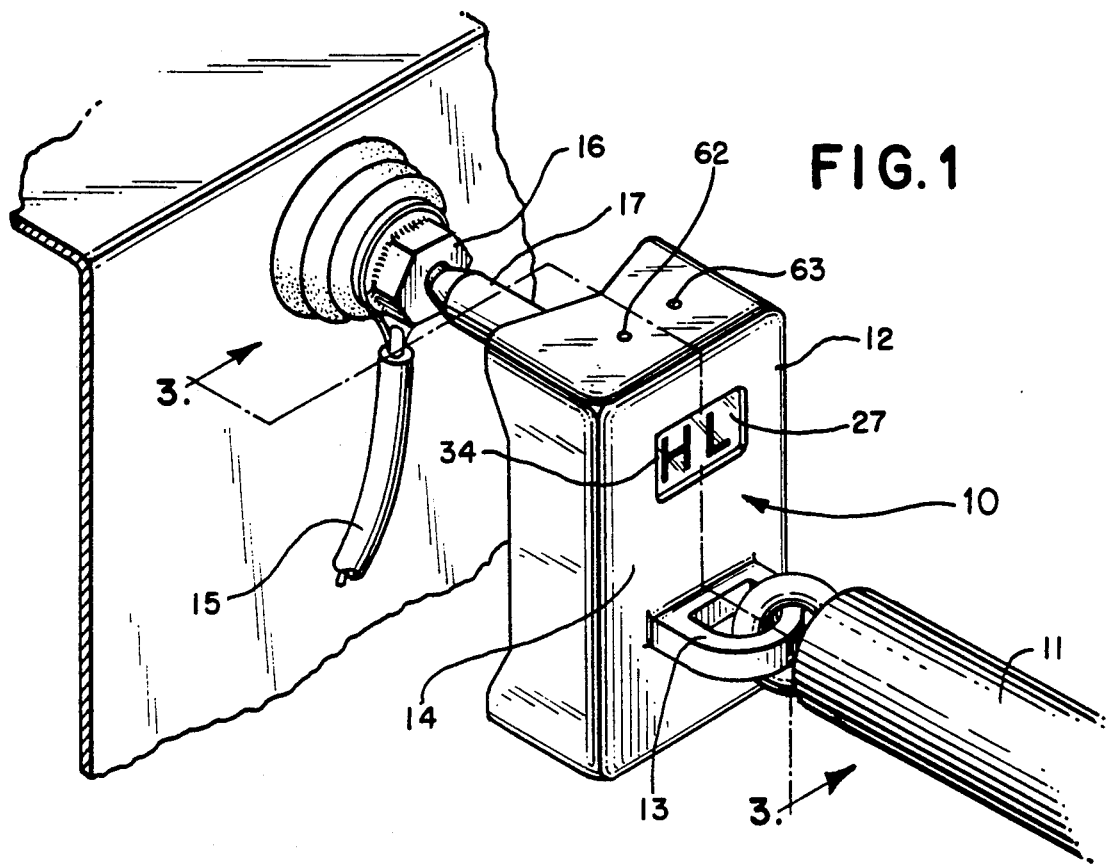
FIG. 1 is an enlarged perspective view of a hot line indicator constructed in accordance with the invention shown in association with an electrical terminal being tested for the presence of voltage.

Referring to the Figures, and particularly to FIGS. 1-5, a hot line indicator 10 for installation on the working end of a conventional lineman's hot stick 11 includes a generally rectangular housing 12 formed of a plastic or other electrically insulating material. Engaging means in the form of a closed hook-eye 13 are preferably formed on the front surface 14 of the housing for engaging the hotstick 11 whereby the indicator can be readily and safely positioned in the vicinity of an energized conductor 15 or terminal 16, as shown in FIG. 1. An elongated probe 17 formed of metal or other electrically conductive material projects from the rear surface 18 (FIG. 3) of housing 12 to establish electrical contact with a circuit being tested.

Within housing 12 the circuit status indicator 10 includes an insulator board 23 positioned perpendicularly to the axis of the housing at a location between the front and rear surfaces thereof, and a layer 24 (FIG. 3) of high electrical resistance potting compound on the inside of the housing for securing the insulator board in place. The projecting probe 17 may be secured to this epoxy layer by a threaded bolt 22 or other suitable fastening means. Additional electrical components included in housing 12 include a coupling element in the form of a metallic plate 25 for coupling the circuitry of the fault indicator to ground, and a high impedance electronic display component 27 for visually indicating the occurrence of a fault current.

Figure 3:
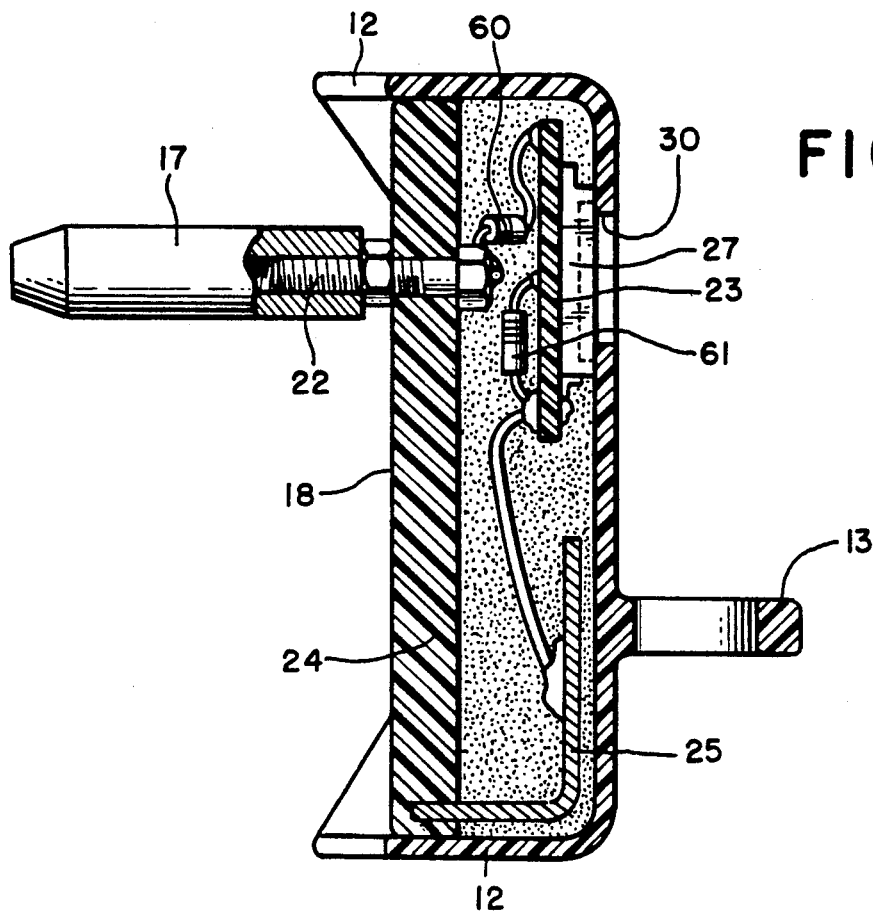
FIG. 3 is an enlarged side sectional view of the hot line indicator taken along line 3—3 of FIG. 1.

As shown in FIG. 3, within housing 12 the liquid crystal display component 27 is positioned against a transparent window 30 such that the indicator face of the component is readily viewable from the exterior of the housing. A mask formed of a thin sheet of opaque material may be provided on the inside surface of window 30 so that only the indicator face can be seen.

Figure 2:
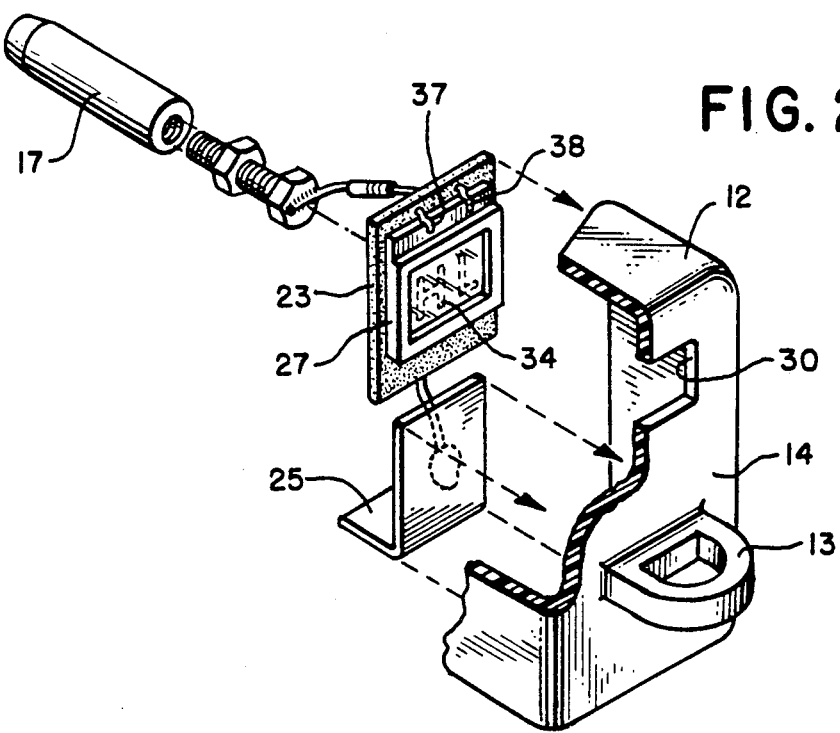
FIG. 2 is an exploded perspective view showing the principal components of the hot line indicator of FIG. 1.

As shown in FIGS. 1-2, the liquid crystal display component 27 is capable of producing an "HL" display 34 to indicate the presence of voltage on conductor 11. Electrical connections are made with the component by means of two electrically conductive terminals 37 and 38 arranged along the top edge of the component.

Figure 4:
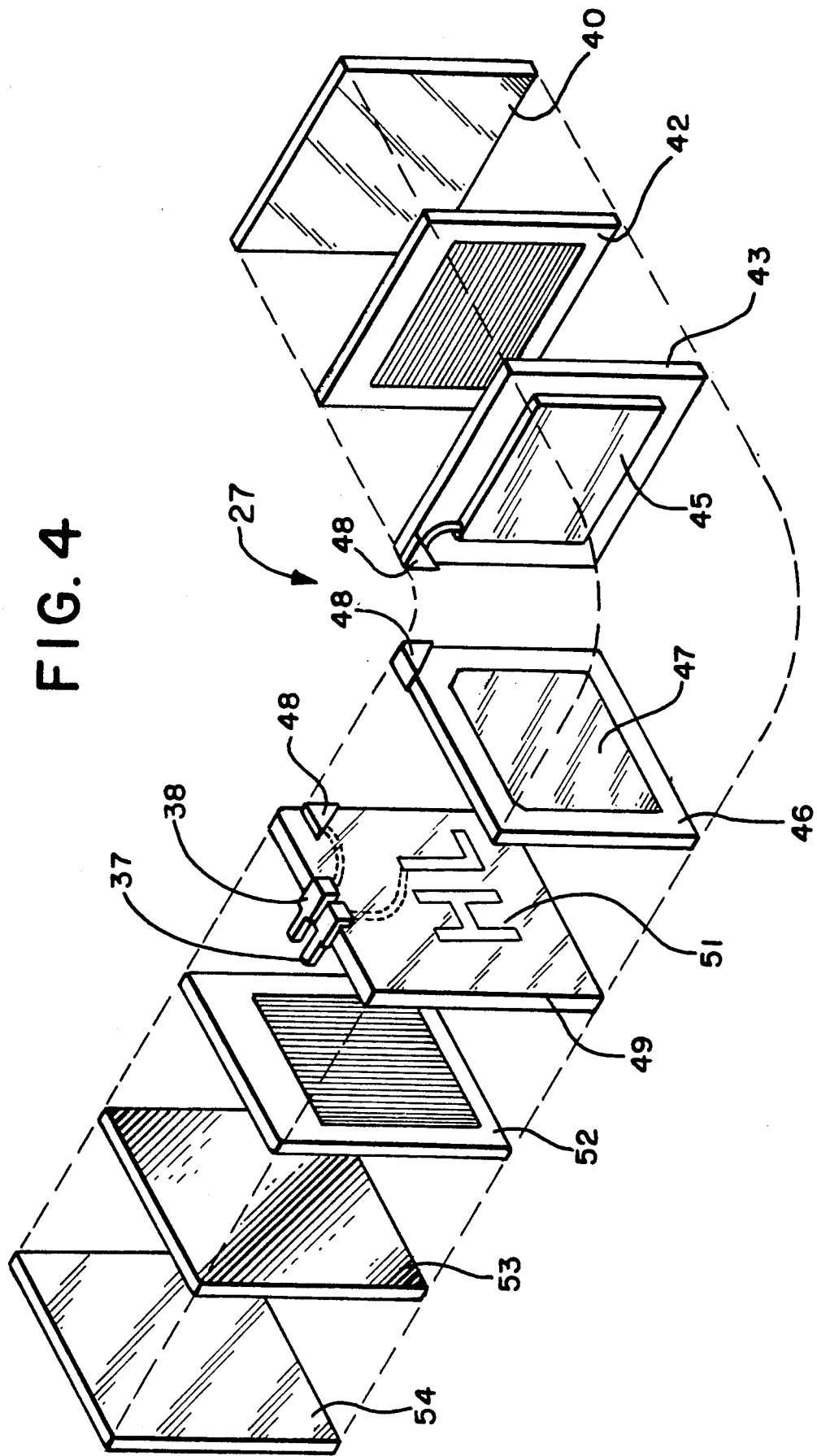
FIG. 4 is an enlarged exploded perspective view showing the principal elements of the liquid crystal display component utilized in the hot line indicator of FIGS. 1-5.

Internally, as shown in FIG. 4, the liquid crystal display component 27 includes generally a transparent face plate 40, a front polarizer 42, a glass plate 43 on which a single transparent backplane display electrode 45 is provided, a perimeter seal 46 containing a layer 47 of twisted nematic liquid crystal material, electrically conductive edge contacts 48, a glass plate 49 on which a single transparent indicator segment display electrode 51 is contained, a rear polarizer 52 aligned at right angles to front polarizer 42, a reflector 53 and a rear supporting plate 54.

Display component 27 is conventional in construction and operation. The "HL" display is formed by the nematic liquid crystal layer 47, which in the absence of an applied electric field has the property of rotating the polarization of light as it passes through the molecular layers of the layer. In particular, as randomly polarized light enters the display component through face plate 40, only vertically polarized light passes through front polarizer 42. In the absence of an applied electric field, the polarization of this polarized light is rotated 90° as it passes through the nematic liquid crystal layer 47 and reaches rear polarizer 50. Since the polarization of the light has been rotated, the light is able to pass through this polarizer onto the reflective layer 51, wherein it is reflected back through polarizer 50, rotated by liquid crystal layer 47 and passed through polarizer 42 to front plate 40 and window 30. Thus, in the absence of an applied electric field light entering face plate 40 is passed through the device and reflected back out, presenting a blank or white colored appearance to the observer.

By applying an electric field between indicator segment electrode 51 and its associated backplane electrode 45 the liquid crystal layer in its intervening portions is caused to pass incoming light without rotating its polarization, thereby selectively blocking the transmission and reflection of light to the viewing window 30 in the "HL" pattern and causing this character to be displayed to a viewer as a darkened letter.

Figure 5:
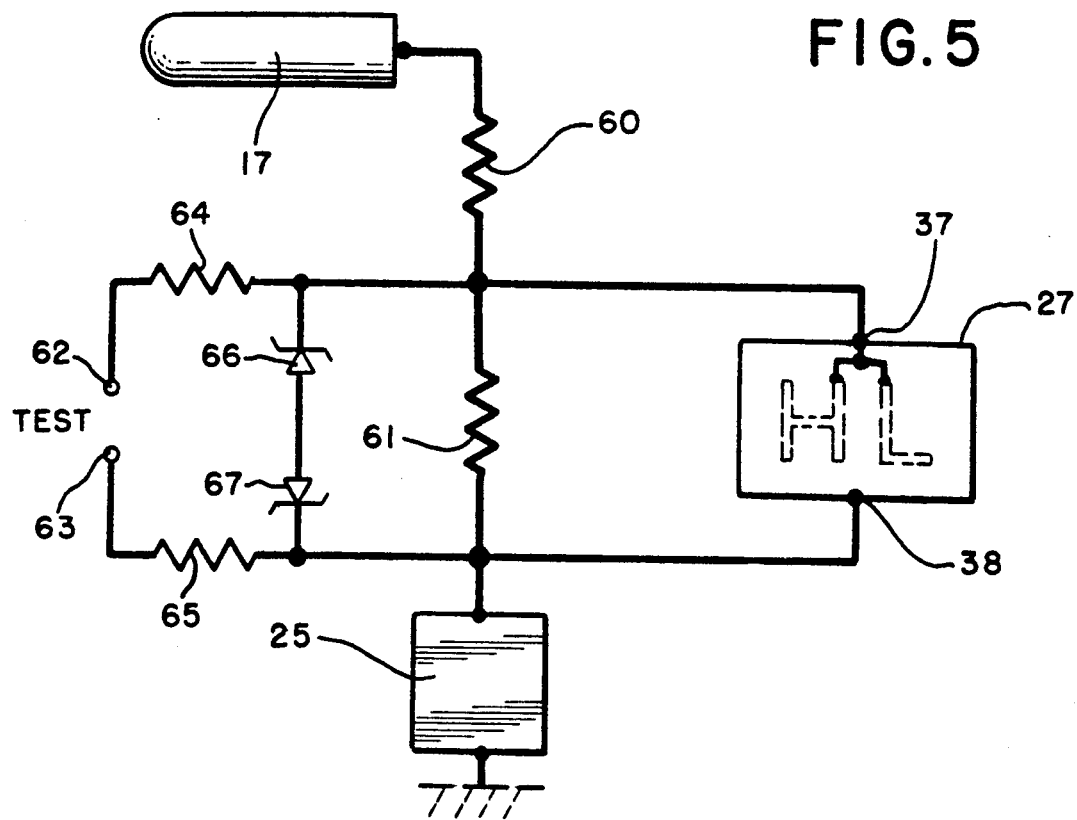
FIG. 5 is an electrical schematic diagram of the hot line indicator of FIGS. 1-4.

Referring to FIG. 5, the necessary signal for actuating the "HL" display is provided by a circuit within housing 12. In particular, the circuit connects the "HL" display electrodes 45 and 51 of display component 27 to system ground through coupling plate 25 and to probe 17 through a resistor 60 to prevent high frequency spark discharge current from flowing through the display component. In the presence of alternating voltage on the monitored conductor the "HL" display 34 is activated and the user is informed that the conductor is powered. Since the circuit capacitances are very small, the display indication is virtually instantaneous, giving the user an immediate indication of circuit status. A resistor 61 may be connected across the display electrodes of device 27 to discharge the display device.

Optionally, a pair of test terminals 62 and 63 may be provided on housing 12 to enable the indicator to be tested. The terminals are electrically connected through isolation resistors 64 and 65 to display device 27 such that, when a test voltage is applied to the terminals, as from a standard nine volt battery or the like (the terminals preferably having a spacing corresponding to the battery), an "HL" indication is produced by display device 27. Two zener diodes 66 and 67 connected back-to-back limit the voltage applied to the display device.

Depending on the particular liquid crystal material used, LCD components exibit a well defined threshold voltage below which the display does not respond to an applied signal. In one successful embodiment of the invention using a Type 7 LCD manufactured by Hamlin, Inc. of Lake Mills, Wis., U.S.A., this threshold is 2.0 volts, which is sufficiently high to prevent the display from falsely responding to residual voltages.

While an "HL" shaped display has been shown, it will be appreciated that other display characters, or symbols, can be used instead. For example, the "HL" can be replaced with a lightning bolt symbol.

Figure 6:
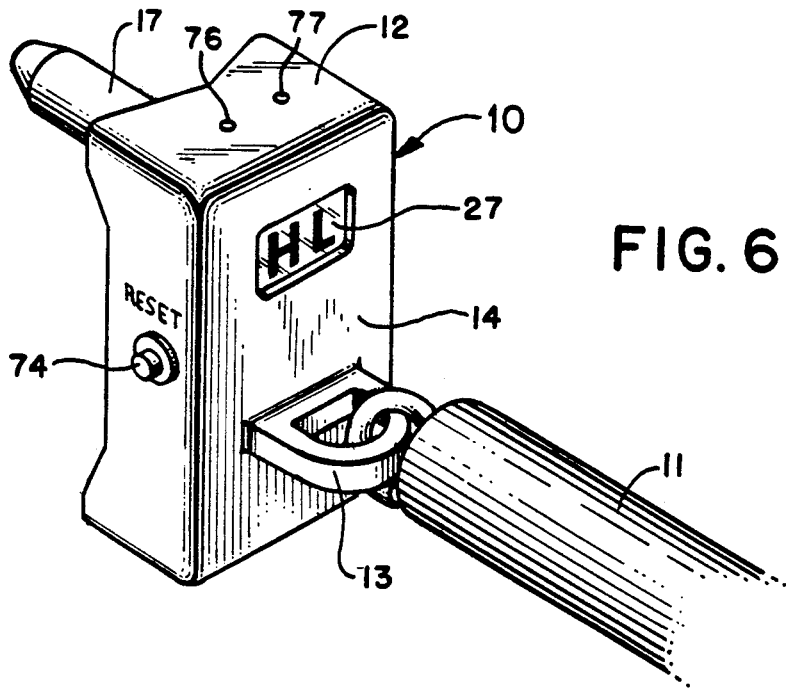
FIG. 6 is a perspective view of an alternate construction of the hot line indicator providing a memory indication of circuit status.
Figure 7:
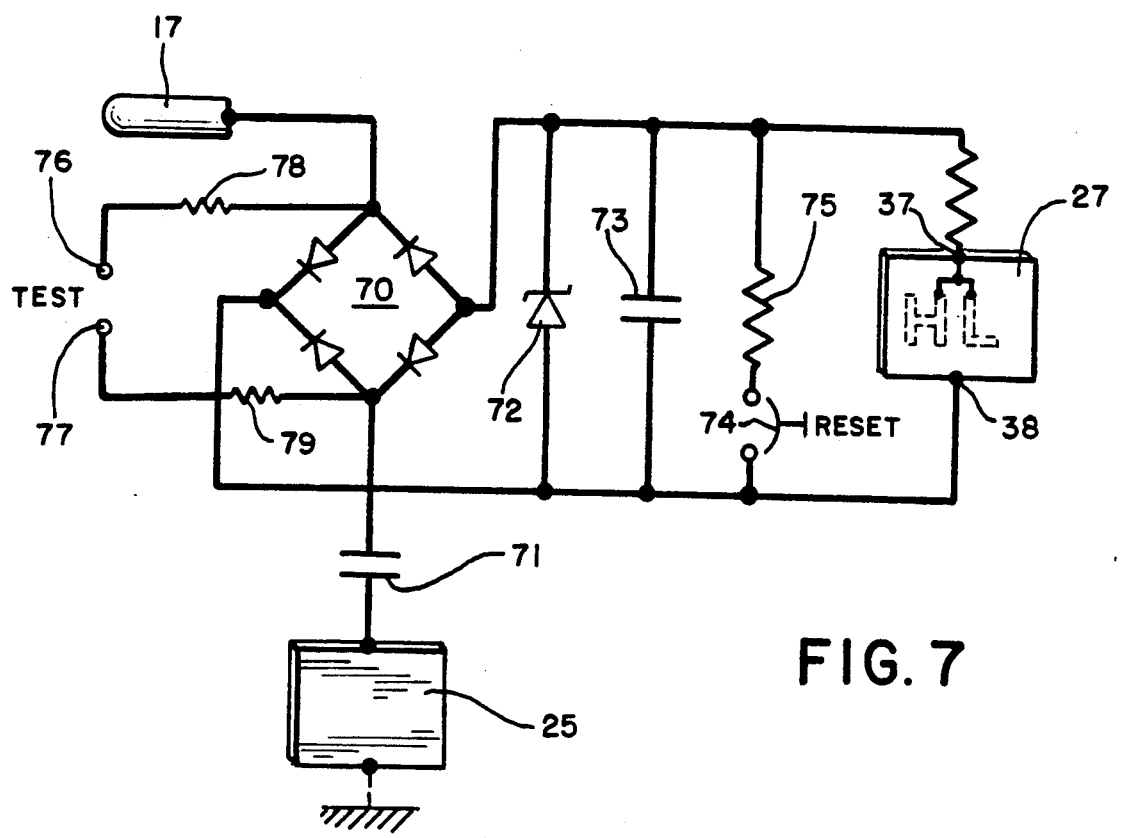
FIG. 7 is an electrical schematic diagram of the hot line indicator of FIG. 6.

The hot line indicator of the invention can also be constructed with a memory such that a circuit or contact can be probed at a distant out-of-sight location, and circuit status read after the indicator is removed. In this embodiment, as shown in FIGS. 6-7, the hot line indicator includes a full wave rectifier 70 having respective input terminals connected directly to probe 17 and through a coupling capacitor 71 to coupling plate 25. The output terminals of the network are connected to a zener diode 72 and capacitor 73 such that a predetermined DC voltage appears across the capacitor when probe 17 is in contact with an energized voltage source. Display device 27, which has display elements connected across capacitor 73, is consequently caused to display an "HL".

Should probe 17 be removed from the source, as when withdrawing the hot stick, capacitor 73 continues to hold a charge and display device 27 continues its "HL" display until the capacitor eventually discharges by reason of its internal leakage, which may take several hours, or by reason of a reset switch 74 being momentarily actuated to discharge capacitor 73 through a series-connected resistor 75. Reset switch 74 can be located at any suitable location on housing 12, such as on a sidewall as shown in FIG. 6.

A test feature can be incorporated in hot line indicator 10 by providing a pair of test terminals 76 and 77 on housing 12. These are connected through isolation resistors 78 and 79 to the input terminals of bridge rectifier network 70 to enable the user to apply a test voltage, such as may be readily obtained from a battery, to the bridge rectifier. It is then possible to confirm the proper functioning of bridge rectifier 90, capacitor 73, display component 27 and reset switch 74.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A hot line indicator for use in conjunction with a lineman's hot stick for visually indicating the presence of voltage in a high voltage AC conductor when positioned in close proximity to the conductor by the hot stick, said indicator comprising:

a housing having a front surface and an oppositely facing rear surface;

an elongated electrically conductive probe member extending from said rear surface of said housing;

a metallic ground coupling member disposed entirely within said housing in spaced-apart relationship to said probe member;

engaging means projecting from said front surface of said housing for receiving the hot stick in locked engagement, whereby said probe member can be fixedly positioned relative to said hot stick;

status indicating means within said housing comprising a high impedance display device having at least a pair of display electrodes disposed in operative association with a layer of voltage-responsive light controlling material, the display device providing on said front surface of said housing a first display condition in the absence of an actuating signal applied to said signal electrodes, and a second display condition in the presence of an actuating signal applied to said display electrodes;

display circuit means for electrically coupling one of said display electrodes to said probe member and the other of said display electrodes to said ground coupling member whereby said display device is caused to display said second display condition in the presence of voltage on said probe member;

a pair of electrical test terminals accessible from the exterior of said housing, and test circuit means for electrically coupling said test terminals to respective ones of said display electrodes, whereby said display device is actuated to said second condition upon application of a test voltage to said test terminals.

2. A hot line indicator as defined in claim 1 wherein said high impedance display device comprises a liquid crystal display having a display segment electrode electrically coupled to said probe member and a backplane electrode electrically coupled to said ground coupling member.

3. A hot line indicator as defined in claim 1 wherein said test circuit means provide a high-impedance ohmic connection between said test terminals and said display electrodes.

4. A hot line indicator for use in conjunction with a lineman's hot stick for visually indicating the presence of a voltage on a high voltage electrical conductor after the indicator has been momentarily positioned in close proximity to the conductor, said indicator comprising:

a housing;

an electrically conductive probe member projecting from said housing;

a display storage capacitor;

status indicating means within said housing comprising a high impedance display device having at least a pair of display electrodes disposed in operative association with a layer of voltage-responsive light controlling material, said display device providing on the exterior of said housing a first display condition in the absence of an actuating signal applied to said display electrodes, and a second display condition in the presence of an actuating signal applied to said display electrodes; and display circuit means within said housing for electrically coupling one of said display electrodes to said probe member and the other of said display electrodes to electrical ground, and for electrically coupling said display electrodes across said display storage capacitor, whereby said display device is actuated to said second display condition following the momentary presence of voltage on said probe member and remains in said second condition pending discharge of said capacitor.

5. A hot line indicator as defined in claim 4 wherein said display circuit means further include switch means actuable from the exterior of said housing for discharging said display storage capacitor to return said display device to said first display condition.

6. A hot line indicator as defined in claim 4 wherein said high impedance display device comprises a liquid crystal display having a display segment electrode coupled to said probe member and an associated backplane electrode coupled to electrical ground.

7. A hot line indicator as defined in claim 4 including a metallic ground coupling member disposed entirely within said housing in spaced-apart relationship to said probe member, and wherein said display circuit means electrically couple said other of said display electrodes to said ground coupling member.

8. A hot line indicator as defined in claim 4 including a pair of test terminals accessible from the exterior of said housing, and test circuit means for electrically coupling said test terminals to said display electrodes, whereby said display device is actuated to said second condition upon application of a test voltage to said test terminals.

9. A hot line indicator for use in conjunction with a lineman's hot stick for visually indicating the presence of voltage in a high voltage AC conductor when positioned in close proximity to the conductor by the hot stick, said indicator comprising:

a housing having a front surface and an oppositely facing rear surface;

an electrically conductive probe member extending from said rear surface of said housing;

engaging means projecting from said front surface of said housing for receiving said hot stick in locked engagement, whereby said probe member is fixedly positioned relative to said hot stick;

status indicating means within said housing comprising a high impedance display device having at least a pair of display electrodes disposed in operative association with a layer of voltage-responsive light controlling material, the display device providing on said front surface of said housing a first display condition in the absence of an actuating signal applied to said display electrodes, and a second display condition in the presence of an actuating signal applied to said display electrodes;

display circuit means for electrically coupling one of said display electrodes to said probe member and the other of said display electrodes to electrical ground whereby said display device is caused to display said second display condition in the presence of voltage on said probe member;

a pair of electrical test terminals accessible from the exterior of said housing; and test circuit means for electrically coupling said test terminals to respective ones of said display electrodes, whereby said display device is actuated to said second condition upon application of a test voltage to said test terminals.

10. A hot line indicator as defined in claim 9 including a metallic ground coupling member entirely disposed within said housing in spaced-apart relationship to said probe member, and wherein said display circuit means electrically couple said other of said display electrodes to said ground coupling member.

11. A hot line indicator as defined in claim 9 wherein said display circuit means further provide a high impedance ohmic connection between said display electrodes.

12. A hot line indicator as defined in claim 9 wherein said high impedance display device comprises a liquid crystal display having a display segment electrode electrically coupled to said probe member and a backplane electrode electrically coupled to electrical ground.

13. A hot line indicator for use in conjunction with a lineman's hot stick for visually indicating the presence of a voltage on a high voltage electrical conductor after being momentarily positioned in close proximity to the conductor, said indicator comprising:

a housing;

an electrically conductive probe member projecting from said housing;

a display storage capacitor;

status indicating means within said housing comprising a high impedance display device having at least a pair of display electrodes disposed in operative association with a layer of voltage-responsive light controlling material, the display device providing on the exterior of said housing a first display condition in the absence of an actuating signal applied to said display electrodes, and a second display condition in the presence of an actuating signal applied to said display electrodes;

display circuit means within said housing for electrically coupling one of said display electrodes to said probe member and the other of said display electrodes to electrical ground, and for electrically coupling said display electrodes across said display storage capacitor, whereby said display device is actuated to said second display condition following the momentary presence of voltage on said probe member and remains in said second condition pending discharge of said capacitor;

a pair of electrical test terminals accessible from the exterior of said housing; and test circuit means for electrically coupling said test terminals to said display electrodes, whereby said display device is actuated to said second condition upon application of a test voltage to said test terminals.

14. A hot line indicator as defined in claim 13 wherein said display circuit means further include switch means actuable from the exterior of said housing for discharging said display storage capacitor to return said display to said first display condition.

15. A hot line indicator as defined in claim 13 wherein said high impedance display device comprises a liquid crystal display having a display segment electrode coupled to said probe member and an associated backplane electrode coupled to electrical ground.

16. A hot line indicator as defined in claim 13 including a metallic ground coupling member disposed within said housing in spaced-apart relationship to said probe member, and wherein said display circuit means electrically couple said other of said display electrodes to said ground coupling member.

* * * * *